US005363036A

United States Patent [19]

Mansfield

[11] Patent Number: 5,363,036

[45] Date of Patent: Nov. 8, 1994

[54] ECHO-VOLUMAR IMAGING USING 180 DEGREE RF PULSES

[75] Inventor: Peter Mansfield, Nottingham, England

[73] Assignee: British Technology Group Ltd., London, England

[21] Appl. No.: 966,037

[22] PCT Filed: Jul. 30, 1991

[86] PCT No.: PCT/GB91/01284

§ 371 Date: Dec. 30, 1992

§ 102(e) Date: Dec. 30, 1992

[87] PCT Pub. No.: WO92/02829

PCT Pub. Date: Feb. 20, 1992

[30] Foreign Application Priority Data

Jul. 31, 1990 [GB] United Kingdom ................ 9016803

[51] Int. Cl.[5] ............................................ G01V 3/00

[52] U.S. Cl. .................................... 324/309; 324/307

[58] Field of Search ............... 324/309, 306, 313, 314, 324/307

[56] References Cited

U.S. PATENT DOCUMENTS

| | | | |
|---|---|---|---|
| 4,684,891 | 8/1987 | Feinberg | 324/309 |
| 4,698,592 | 10/1987 | Feinberg | 324/309 |
| 4,716,369 | 12/1987 | Sekihara et al. | 324/309 |
| 4,746,864 | 5/1988 | Satoh | 324/309 |
| 4,799,013 | 1/1989 | Hatanaka | 324/312 |
| 4,818,940 | 4/1989 | Hennig et al. | 324/309 |
| 5,212,448 | 5/1993 | Le Roux et al. | 324/309 |
| 5,221,898 | 6/1993 | Takiguchi et al. | 324/309 |

FOREIGN PATENT DOCUMENTS

| | | |
|---|---|---|
| 0091008 | 10/1983 | European Pat. Off. . |
| 0240319 | 10/1987 | European Pat. Off. . |
| WO9102263 | 2/1991 | WIPO . |

OTHER PUBLICATIONS

D.N. Guilfoyle, et al., "Echo-planar Imaging Using 180° RF Pulses, Society for Magnetic Resonance Imaging, 8th Meeting, Vol. 2, August 1989, page 829

P. Mansfield, et al., "Volumar Imaging Using NMR Spin Echoes: Echo-volumar Imaging at 0.1 T", J. Phys.E: Sci. Instrum., Vol. 22, No. 5, May 1989, pp 324–330

P. Mansfield, "Multi-planar Image Formation Using NMR Spin Echoes", J.Phys.C: Solid State Phys., Vol. 10, 1977, pp L55–L58

*Primary Examiner*—Louis Arana

*Attorney, Agent, or Firm*—Cushman, Darby & Cushman

[57] ABSTRACT

A method of producing a magnetic resonance image of a defined region of an object by an echo volumar imaging process including subjecting the object to an initial selection process to select a thick slice within the object to produce an active volume of spin magnetisation subjecting the active volume so defined to a combination of 180° RF pulses and suitably modulated x, y and z gradients to produce an echo volumar image.

11 Claims, 6 Drawing Sheets

ECHO-VOLUMAR IMAGING USING 180 DEGREE RF PULSES

FIELD OF THE INVENTION

The present invention relates to magnetic resonance imaging systems and, more particularly, to Echo Volumar Imaging (EVI) using 180° RF pulses.

BACKGROUND AND SUMMARY OF THE INVENTION

Magnetic Resonance imaging using the echo-volumar imaging approach (P. Mansfield, A. M. Howseman and R. J. Ordidge, Volumar Imaging (EVI) at 0.1 T, J. Phys. E. 22, 324–330 (1989) allows the simultaneous examination of several planes within a defined thick slice to be observed in the same time as would be necessary for the examination of a single plane in echo-planar imaging (P. Mansfield, A. M. Howseman and R. J. Ordidge, Volumar Imaging using NMR Spin Echoes, J. Phys. C. 10, L55 (1977) EPI. Following an initial thick slice selection process, the spin system is encoded along three principal axes, using suitably modulated x, y and z linear magnetic gradients. This type of echo-volumar imaging works well for homogenous specimens at high field and for less homogenous specimens at low field. The operating field strength comes into question since bulk susceptibility artefacts are induced, causing a degradation of the static field homogeneity. If this static field homogeneity is degraded too far, EVI as described above becomes impractical with the gradient strengths and switching rates currently available.

It is an object of the present invention to provide a means of overcoming the induced local field effects arising from susceptibility effects. The EVI modification uses 180° RF pulses instead of gradient reversals. A similar modification has been described for use with Echo Planar Imaging EPI in British Patent Application 8918105.1.

The present invention therefore provides a method of producing a magnetic resonance image of a defined region of an object by an echo volumar imaging process including subjecting the object to an initial selection process to select a thick slice within the object to produce an active volume of spin magnetisation characterized in that said method further includes subjecting the active volume so defined to a combination of 180° RF pulses and suitably modulated x, y and z gradients to produce an echo volumar image.

BRIEF DESCRIPTION OF THE EMBODIMENTS

Embodiments of the present invention will now be described by way of example with reference to the accompanying drawings, in which:

FIG. 3(*b*) shows an alternative scanning procedure to FIG. 3(*a*) in which the scan starts in the central z=0 and steps out subsequently through pairs of conjugal planes finishing at the ±z plane.

FIG. 4(*b*) shows an alternative timing diagram for a modified hybrid EVI sequence using 180° RF pulses.

DETAILED DESCRIPTION OF THE INVENTION

The modified EVI sequence employs short 180° RF pulses instead of gradient reversal. In one version described below, the 180° RF pulses are non-selective, but variants of the new sequence are possible in which short selective 180° pulses are used instead. In this section we concentrate on the use of non-selective 180° pulses.

Figure 1:
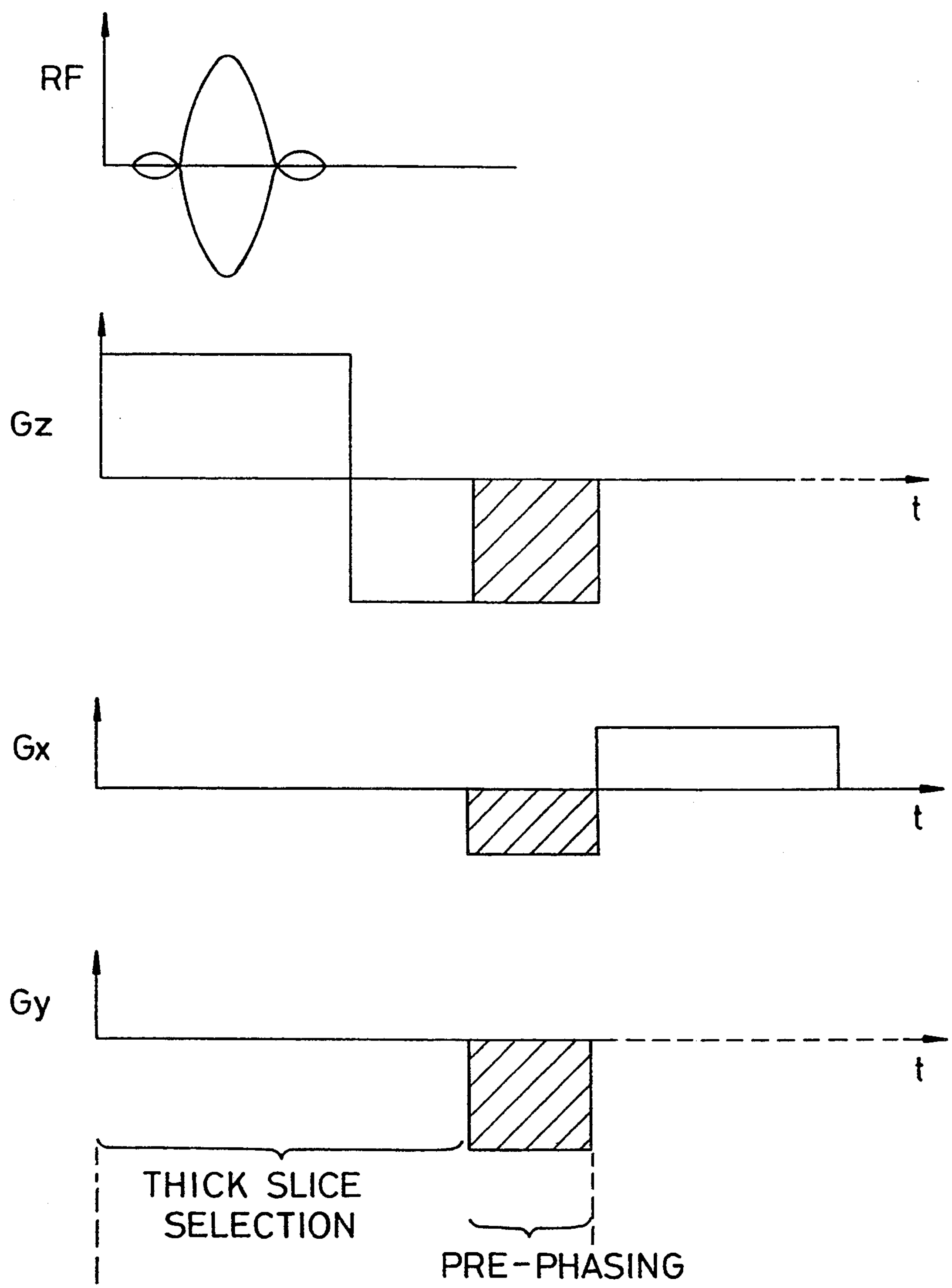
FIG. 1 shows a timing diagram for the initial thick slice selection phase. Also included are the pre-phasing pulses for $G_x$, $G_y$ and $G_z$ (shaded)

The timing diagram for the initial thick slice selection is shown in FIG. 1. Here a shaped RF pulse is used to selectively excite a thick slice in the presence of a gradient $G_z$. Also applied in this time frame are pre-phasing pulses $G_x$, $G_y$ and $G_z$ (shaded). It is emphasised that the initial slice selection process described is a particular example of a range of initial slice selection or volumar selection processes, which could precede the volumar encoding phase, in which the Rf shape is modulated in the presence of one or more gradients to define a more general volume of active spins.

Figure 2:
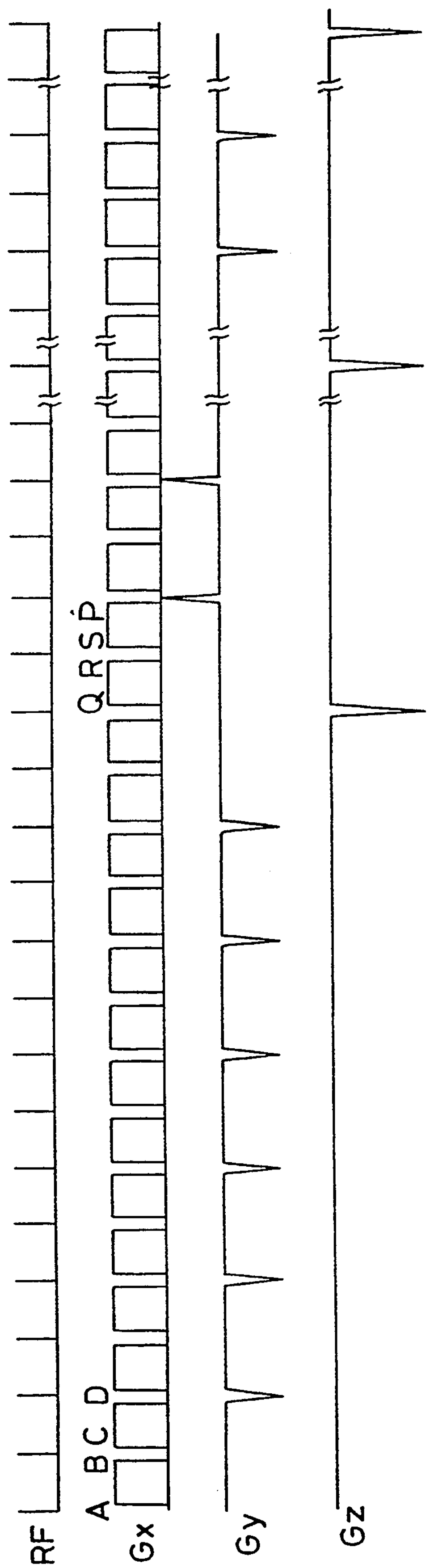
FIG. 2 shows a timing diagram for the modified EVI sequence using 180° RF pulses. (Note the gradient $G_x$ is monopolar with small gaps or notches allowing a window for the application of the non-selective RF selective pulses and also the application of $G_y$, and $G_z$ gradient blips).

Following the initial slice selection phase, RF pulses and gradient pulses are applied as indicated in FIG. 2. Unlike standard EVI, the gradient $G_x$ is monopolar with small gaps or windows as indicated, in which the RF pulses are applied. In this version of the experiment the gradient $G_y$ is applied in the form of short blips which are arranged to fall in alternate $G_x$ gaps, but so as not to coincide with the RF pulses. In the example given, the $G_y$ blips precede the RF pulses. The $G_z$ gradient is also applied in the form of blipped pulses, but less frequently as indicated. These also precede the RF pulses in the example given.

Figure 3A:
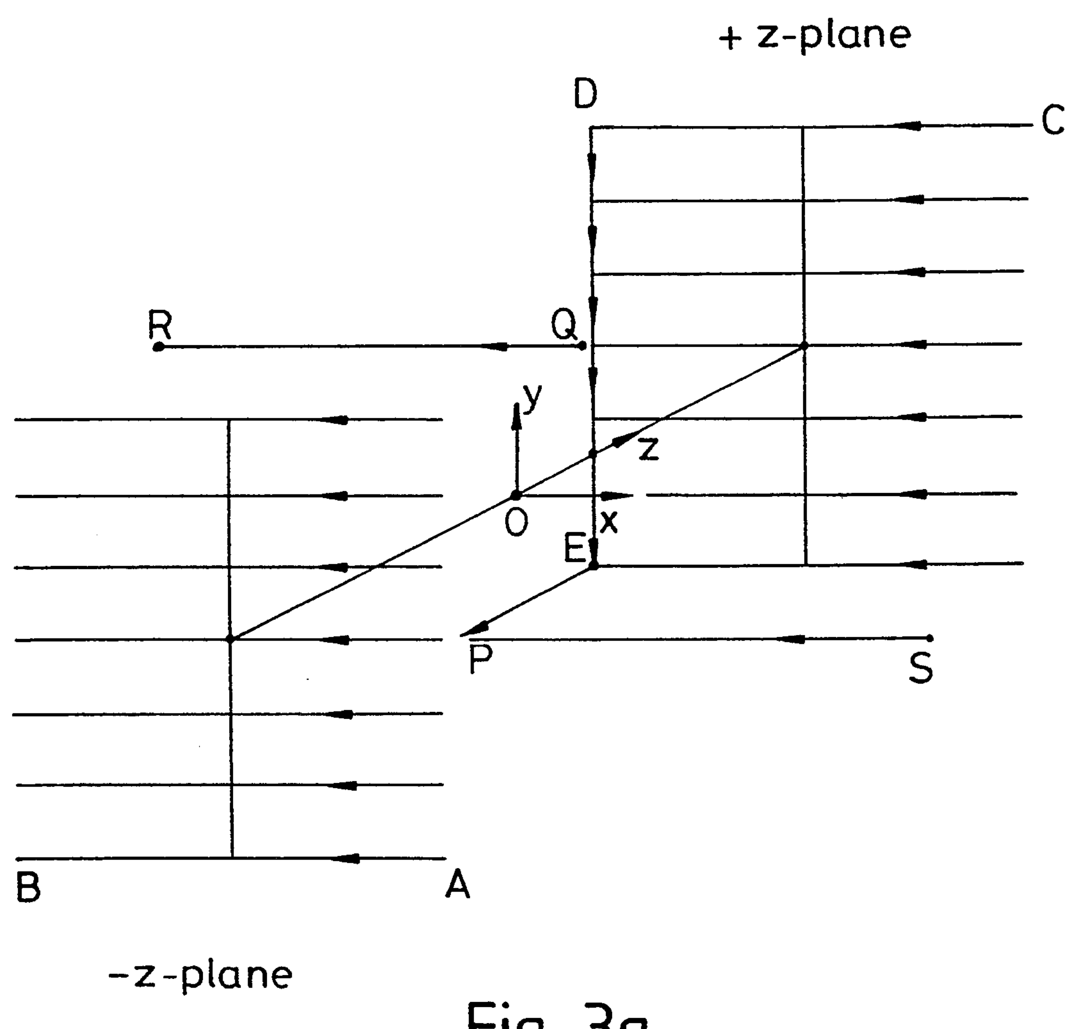
FIG. 3(*a*) shows the k-space trajectory for the modified EVI sequence shown in FIG. 2. (Note that the effect of the 180° RF pulse is to take the k-trajectory to a conjugate point in k-space)
Figure 3B:
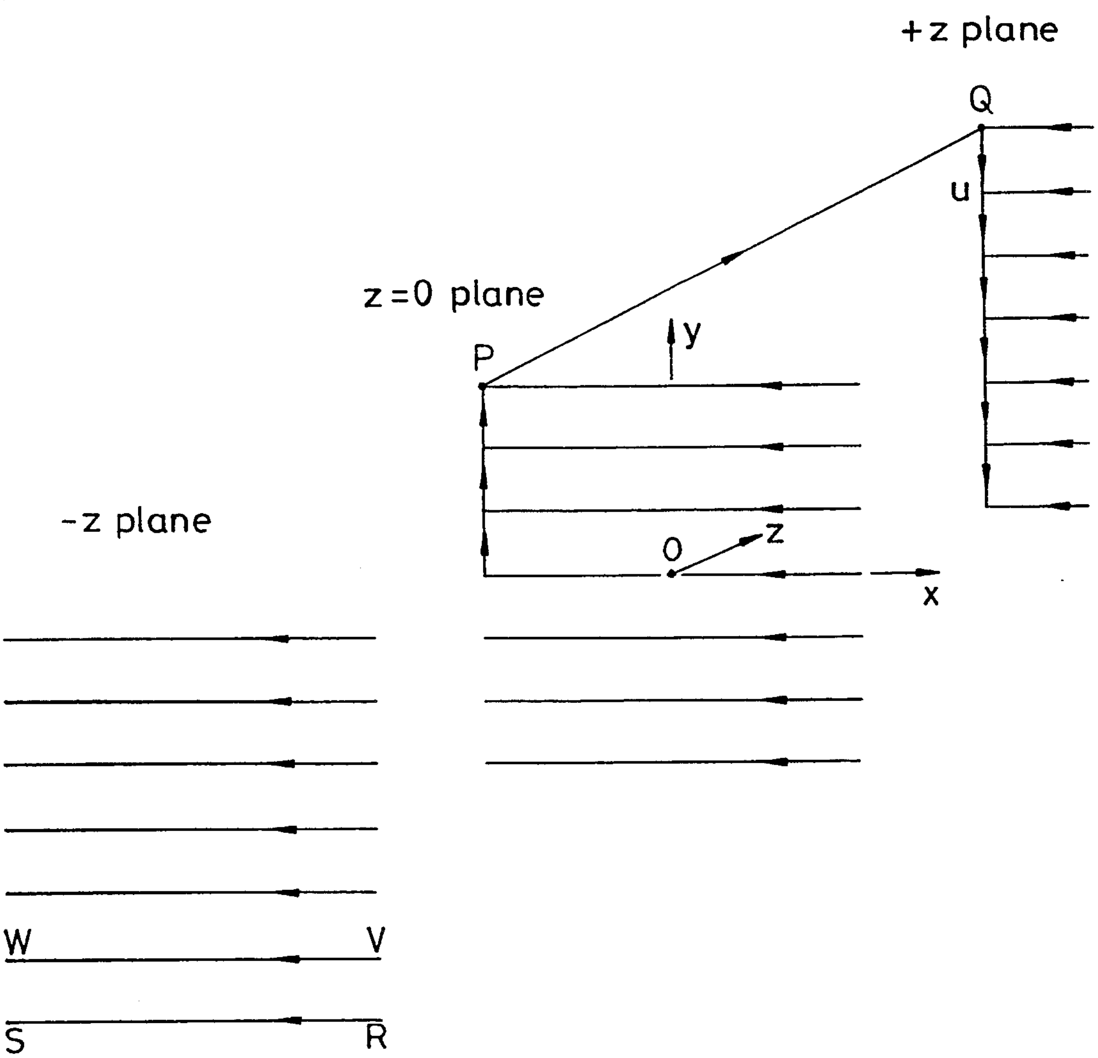

The complex three-dimensional path through k-space is indicated in FIG. 3(*a*). The scan starts at A and moves to B under the action of $G_x$ (see FIG. 2). The application of a 180° RF pulse then takes the locus of k-space to the conjugate point C and then on to D, etc. Following the scan of conjugate planes at ±z the k-locus ends up at point E. The first $G_z$ blip is then applied taking the scan to P. A 180° pulse then moves the scan to the conjugate point Q. Under the action of $G_x$ the scan proceeds to R. Another 180° pulse then takes the scan to S and then on to P, etc. In this way pairs of conjugate z-planes are scanned ending up on the z=0 plane. However, the procedure could be reversed by starting the scan in the z=0 plane and hopping to pairs of conjugate planes ending up at the ±z planes as indicated in the k-trajectory of FIG. 3(*b*). In this example, the initial z=0 plane is scanned using $+G_y$ blips to reach point P. A $+G_z$ blip takes the scan to Q. The conjugate ±z planes are scanned using $-G_y$ blips and the sign of $G_y$ is reversed in the alternate sets of conjugate planes. $G_x$ is monopolar with windows for the 180° RF pulses and blipped gradients.

The effect of this rather complex trajectory through k-space means that the signal data obtained in such a sequence are properly ordered so that a Fourier transform can reconstitute the three-dimensional image set from the 3-D k-space data set.

The use of 180° RF pulses means that any spin dephasing due to local inhomogeneity effects is reversed and, therefore, is effectively removed as an artefact from the final image.

Naturally the mean RF power deposition in a patient would be greater for this type of EVI, but in imaging applications where power deposition is no problem, i.e. the study of inanimate spin distributions, such a sequence could prove of value. In medical imaging applications an alternative approach in which occasional 180° RF pulses are used could be beneficial.

Occasional 180° RF Pulses

Figure 4:
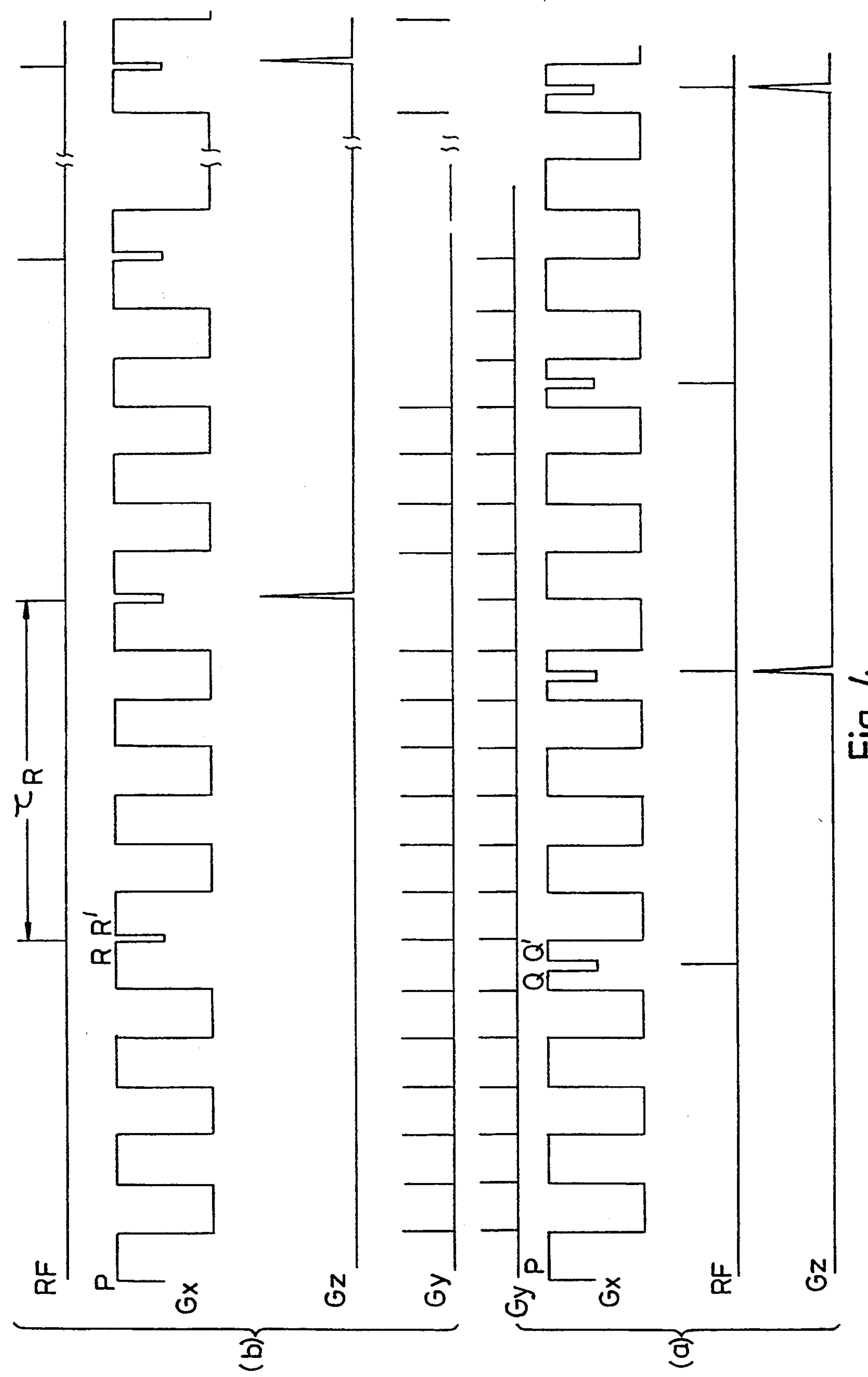
FIG. 4(*a*) shows a timing diagram for a modified hybrid EVI sequence in which occasional 180° pulses are used on conjunction with a bipolar $G_x$ gradient.
Figure 5:
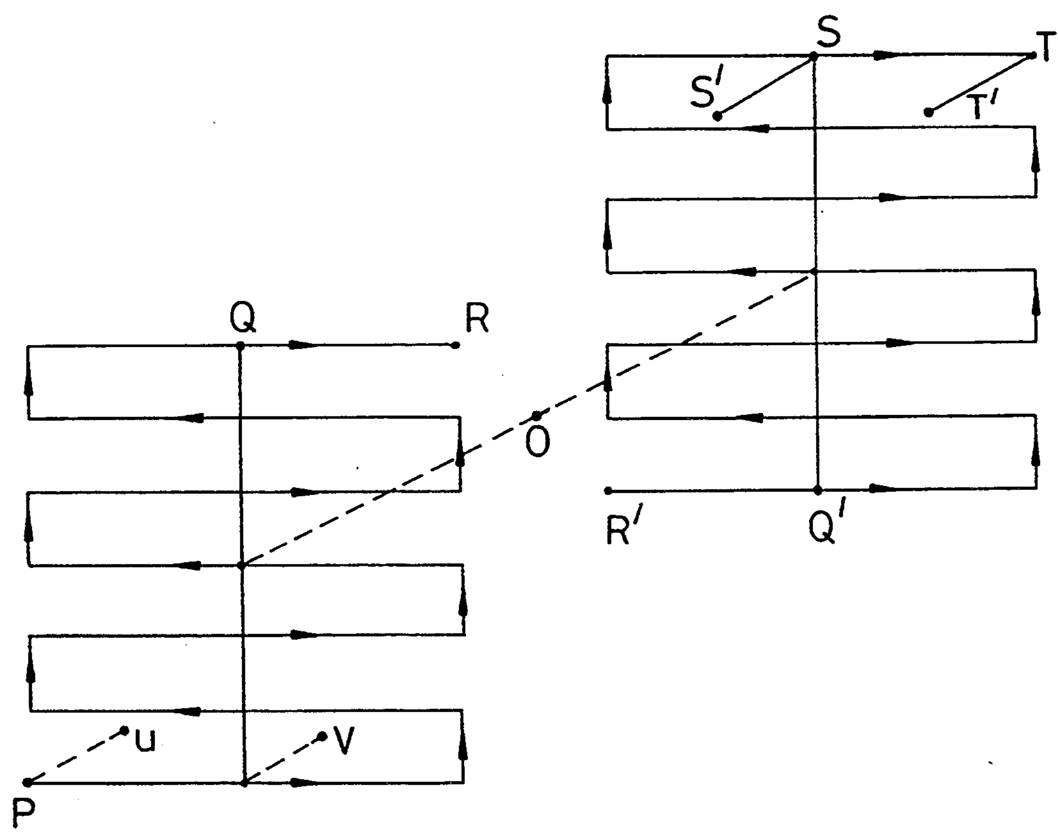
FIG. 5 shows the k-space trajectory for the hybrid EVI sequence shown in FIGS. 4(*a*) and 4(*b*), a) conjugate points Q→Q' b) conjugate points R→R'

In this version of EVI, a combination of occasional 180° RF pulses in conjunction with gradient reversal is proposed. Two versions of the pulse timing diagram following initial slice selection are indicated in FIG. 4. In both scans $G_x$ is modulated for a short period to provide spatial encoding along the x-axis. At the same time the gradient $G_y$ is applied in short blips at points corresponding to the zero crossings of $G_x$. The difference in 4(*a*) and 4(*b*) lies in the way the conjugate z scans are terminated. Looking at the k-space trajectory for these sequences, FIG. 5, the path taken in this initial phase of the experiment corresponds to scanning k-space in a given z-plane determined by the size of the initial $G_z$ pre-pulse. Let the scan start at point P. Following this plane scan, a 180° RF pulse is applied taking the k-trajectory from point Q to a conjugate point Q′ in the k-space diagram, (see FIG. 4(*a*), or from R to R′ (see FIG. 4(*b*). At this point the gradient $G_x$ must continue with the same phase to scan the conjugate plane. At the end of this scan, (either points S or T), a $G_z$ blip is applied taking the k-locus to either S′ or T′ in order to scan an adjacent z-plane and its corresponding conjugate plane. This is then followed by a 180° RF pulse taking the k-locus to either point U or V. This process is repeated with a series of $G_z$ blips until the scan finishes in the $z=0$ plane.

In a modification which uses less RF power, alternate RF pulses are omitted and the $G_y$ blips between missing RF pulse pairs are reversed in sign. In a further modification, the whole scanning process starts in the $z=0$ plane and steps out in conjugate pairs of planes finishing in the planes $\pm z$.

With these sequences it is possible to scan the whole of 3-D k-space in a single pass in times of the order of 100 ms. During the k-trajectory scan, data are sampled. With suitable data reordering and by Fourier transformation, a three-dimensional image of the object can be produced.

The use of occasional RF pulses as outlined above will work only if the loss of signal due to inhomogeneous spin dephasing is small in the time $T_R$. This could well be the case in medical imaging applications where the susceptibility difference between tissues and organs in for example the abdomen or the head, (excluding gaseous or bony cavities), is small. In this situation the use of occasional RF pulses as indicated will dramatically reduce the RF power deposition within the patient, making the method acceptable clinically and at the same time more robust and less dependent on high static magnetic field homogeneity.

Although we have emphasised the use of blipped or short duration $G_y$ and $G_z$ gradients in the above description, it is pointed out that EVI images may also be obtained where $G_y$ is applied in the form of a square or trapezoidally modulated waveform, or as a constant low level waveform and $G_z$ is applied as a constant low level waveform. It is also possible to use combinations of the above described waveforms with blipped waveforms.

We have presented modifications to echo-volumar imaging (EVI) which incorporate the use of 180° RF pulses to either completely replace bipolar gradient modulation or to partially replace bipolar gradient modulation. In both cases the use of 180° RF pulses has the effect of effectively removing induced local inhomogeneities due to susceptibility effects of the sample at high magnetic field strengths. Such inhomogeneity effects are common in patient imaging and spectroscopy at high static field strengths, and in such cases the use of occasional RF pulses is a means of overcoming the deleterious effects of induced inhomogeneity while at the same time subjecting the patient to an acceptable RF power deposition.

I claim:

1. A method of producing a magnetic resonance three-dimensional image of a defined region of an object by an echo volumar imaging process, comprising the steps of: subjecting the object to an initial selection process to select a thick slice within the object to produce an active volume of spin magnetisation; and subjecting the active volume so defined to a combination of 180° RF pulses and modulated x, y and z gradients to produce an echo volumar three-dimensional image.

2. A method of producing a magnetic resonance image of a defined region of an object by an echo volumar imaging process as claimed in claim 1 in which the combination of the modulated x, y and z gradients ($G_x$, $G_y$, $G_z$) and the 180° RF pulses produces a complex trajectory in k-space which ensures that signal data obtained in such a sequence is ordered such that a Fourier transform is able to reconstitute a three dimensional image set from the three dimensional k-space data set.

3. A method of producing a magnetic resonance image of a defined region of an object by an echo volumar imaging process as claimed in claim 2 in which the x gradient ($G_x$) is monopolar with small gaps (or windows) within which the RF pulses are applied.

4. A method of producing a magnetic resonance image of a defined region of an object by an echo volumar imaging process as claimed in claim 3 in which the modulated y gradient ($G_y$) comprises a series of short blips which are arranged to fall in alternate $G_x$ gaps but not to coincide with the RF pulses.

5. A method of producing a magnetic resonance image of a defined region of an object by an echo volumar imaging process as claimed in claim 4 in which the $G_y$ blips precede the RF pulses within the $G_x$ gaps.

6. A method of producing a magnetic resonance image of a defined region of an object by an echo volumar imaging process as claimed in claim 5 in which the modulated z gradient ($G_z$) is applied as a series of blipped pulses at predetermined intervals the $G_z$ pulses being less frequent than the $G_y$ pulses.

7. A method of producing a magnetic resonance image of a defined region of an object by an echo volumar imaging process as claimed in claim 6 in which the $G_z$ pulses precede the RF pulses within the gaps in the $G_x$ pulses.

8. A method of producing a magnetic resonance image of a defined region of an object by an echo volumar imaging process as claimed in claim 2 in which the x gradient ($G_x$) is modulated for a short period to provide spatial encoding along the x-axis and in which the y gradient ($G_y$) is applied in short blips at points corresponding to the zero crossings of $G_x$.

9. A method of producing a magnetic resonance image of a defined region of an object by an echo volumar imaging process as claimed in claim 8 in which the modulated z gradient ($G_z$) pulses are applied during periods in which the $G_x$ gradient is zero; the $G_z$ pulses being applied less frequently than the $G_y$ pulses.

10. A method of producing a magnetic resonance image of a defined region of an object by an echo volumar imaging process as claimed in claim 2 in which the modulated y gradient $G_y$ is applied in the form of a square or trapezoidally modulated waveform and in which the modulated z gradient ($G_z$) is applied in the form of a constant low level waveform.

11. A method of producing a magnetic resonance image of a defined region of an object by an echo volumar imaging process as claimed in claim 2 in which the modulated y gradient ($G_y$) is applied in the form of a low level waveform and in which the modulated z gradient $G_z$ is applied in the form of a constant low level waveform.

* * * * *